(12) United States Patent
Shim

(10) Patent No.: US 7,531,391 B2
(45) Date of Patent: May 12, 2009

(54) CMOS IMAGE SENSOR AND METHOD FOR MANUFACTURING THE SAME

(75) Inventor: Hee Sung Shim, Seoul (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 496 days.

(21) Appl. No.: 11/318,574

(22) Filed: Dec. 28, 2005

(65) Prior Publication Data

US 2006/0138483 A1    Jun. 29, 2006

(30) Foreign Application Priority Data

Dec. 29, 2004   (KR) ...................... 10-2004-0114778

(51) Int. Cl.
*H01L 21/00*   (2006.01)
(52) U.S. Cl. ...................... 438/149; 438/128; 438/157; 438/283; 257/59; 257/72
(58) Field of Classification Search ............ 257/59, 257/72, 88–93; 438/48, 128, 149, 151, 157, 438/283
See application file for complete search history.

(56) References Cited

U.S. PATENT DOCUMENTS 6,690,423 B1 *  2/2004  Nakamura et al. .......... 348/311

FOREIGN PATENT DOCUMENTS

| KR | 10-2003-0049109 |   | 6/2003 |
| KR | 1020030049109 A | * | 6/2003 |

* cited by examiner

*Primary Examiner*—Evan Pert
*Assistant Examiner*—Scott R Wilson
(74) *Attorney, Agent, or Firm*—McKenna Long & Aldridge LLP

(57) ABSTRACT

A CMOS image sensor includes a semiconductor substrate with a first conductive type including a photodiode region and a transistor region, a gate electrode formed on the transistor region of the substrate, a first impurity region with a second conductive type formed in a portion of the semiconductor substrate between the photodiode region and the gate electrode, and a second impurity region with the second conductive type formed in the photodiode region of the semiconductor substrate.

4 Claims, 9 Drawing Sheets

CMOS IMAGE SENSOR AND METHOD FOR MANUFACTURING THE SAME

CROSS-REFERENCE TO RELATED APPLICATION

This application claims the benefit of Korean Patent Application No. 10-2004-0114778, filed on Dec. 29, 2004, which is hereby incorporated by reference for all purposes as if fully set forth herein.

BACKGROUND OF THE INVENTION

1. Field of the Invention

The present invention relates to a CMOS image sensor and a method for manufacturing the same, and more particularly, to a CMOS image sensor in which an n-type impurity region is formed between a photodiode and a transfer transistor for decreasing a dark current and dead-zone, and a method for manufacturing the same.

2. Discussion of the Related Art

Generally, image sensors are semiconductor devices for converting an optical image into an electric signal. The image sensors are basically classified into charge coupled devices (CCDs) or complementary metal oxide silicon (CMOS) image sensors.

The charge coupled device (CCD) includes a plurality of photodiodes, which are arranged in a matrix, each photodiode converting an optical signal into an electric signal. In the matrix of the photodiodes, a plurality of vertical charge coupled devices (VCCDs) are provided between the respective vertically arranged neighboring photodiodes to transmit electric charges, generated by the respective photodiodes, in a vertical direction, and a plurality of horizontal charge coupled devices (HCCDs) are provided to transmit the electric charges, transmitted by the respective vertical charge coupled devices, in a horizontal direction. Also, a sense amplifier is provided to sense the horizontally transmitted electric charges, and consequently, to output electric signals.

Disadvantages of the charge coupled device (CCD) include a complicated driving method, high electric power consumption, and a complicated manufacturing process requiring a multi-step photo process. In the case of the charge coupled device (CCD), it is also difficult to integrate a control circuit, signal processing circuit, analog/digital conversion circuit (A/D converter), and other components into a charge coupled device chip. This makes it impossible to achieve compact-sized products.

Recently, the complementary metal oxide silicon (CMOS) image sensor has been proposed to solve the problems associated with the charge coupled device (CCD). The CMOS image sensor is a device employing CMOS technology, which uses a control circuit and signal processing circuit as peripheral circuits, such that a number of MOS transistors, each associated with a unit pixel, are formed on a semiconductor substrate, whereby outputs of the respective unit pixels are sequentially detected by the MOS transistors by a switching method. That is, in the CMOS image sensor, a photodiode and MOS transistor are formed in a unit pixel to sequentially detect electric signals of the respective unit pixels by a switching method, thereby achieving an image.

As a result of employing CMOS manufacturing technology, the CMOS image sensor can have several advantages, for example, low electric power consumption, and a simplified manufacturing process based on a reduced number of photo process steps. Also, the CMOS image sensor enables a control circuit, signal processing circuit, analog/digital conversion circuit, and other components to be integrated into a CMOS image sensor chip, and therefore, can easily achieve a compact product size. For this reason, the CMOS image sensor is widely applied in various fields, such as for example, digital still cameras and digital video cameras.

Meanwhile, the CMOS image sensors may be classified into 3T-type, 4T-type, or 5T-type CMOS image sensors in accordance with the number of transistors. The 3T-type CMOS image sensor has one photodiode and three transistors, and the 4T-type CMOS image sensor has one photodiode and four transistors.

FIG. 1 is a diagram illustrating the layout of a unit pixel provided in a conventional 4T-type CMOS image sensor, and FIG. 2 is an equivalent circuit diagram illustrating the unit pixel of the conventional 4T-CMOS image sensor of FIG. 1.

As shown in FIGS. 1 and 2, the unit pixel of the conventional 4T-type CMOS image sensor includes an active region 10 defined therein, such that one photodiode 20 is formed in a wide portion of the active region 10, and gate electrodes 110, 120, 130, and 140 of four transistors are formed to overlap with the remaining active region 10. Specifically, a transfer transistor Tx is formed by the gate electrode 110, a reset transistor Rx is formed by the gate electrode 120, a drive transistor Dx is formed by the gate electrode 130, and a select transistor Sx is formed by the gate electrode 140. Here, impurity ions are injected into the active region 10 of the respective transistors, except for portions below the gate electrodes 110, 120, 130, and 140, such that source/drain regions of the respective transistors are formed. Accordingly, a power supply voltage Vdd is applied to the source/drain region between the reset transistor Rx and the drive transistor Dx, and a power supply voltage Vss is applied to the source/drain region at a side of the select transistor Sx.

Hereinafter, a method for manufacturing the conventional CMOS image sensor having the above described configuration will be described.

FIGS. 3A to 3E are sectional views illustrating the sequential processes of a conventional CMOS image sensor manufacturing method, taken along line I-I of FIG. 1.

Referring to FIG. 3A, a low-density p-type epitaxial layer 2 is formed on a p-type semiconductor substrate 1. Subsequently, the epitaxial layer 2 is subjected to exposure and development processes using a mask, which defines an active region and a device isolation region, such that the epitaxial layer 2 of the device isolation region is etched to a predetermined depth to form a trench. Then, an $O_3$ TEOS film is formed on the substrate to fill the trench, and is patterned by use of a chemical mechanical polishing (CMP) process to remain only in the trench region. In this way, a device isolation film 3 is formed in the device isolation region.

A gate insulation film and a conductive layer are then formed on an entire surface of the substrate in this sequence and are selectively removed to form a gate insulation film 4 and a gate electrode 5.

Referring to FIG. 3B, a photoresist film is deposited on the entire surface of the substrate and subjected to exposure and development processes, such that a photoresist film pattern 6 is formed to expose a photodiode region. Specifically, the photoresist film pattern 6 is configured such that it exposes a part of the gate electrode 5 while covering a part of the active region adjacent to the device isolation film 3. Then, n-type impurity ions are injected into the epitaxial layer 2 of the photodiode region via a high-energy ion injection process to form a photodiode n-type impurity region 7. After the formation of the photodiode n-type impurity region 7, the photoresist film pattern 6 is removed.

When the photodiode n-type impurity region 7 is formed by injecting the n-type impurity ions via the high-energy ion injection process, the n-type impurity ions may be doped into a channel region below the gate electrode 5 by passing through the gate electrode 5. Here, it should be noted that the transfer transistor should be manufactured to have a low threshold voltage for a fast transfer of electric charges. However, since the n-type impurity ions are doped into the channel region below the gate electrode 5, a threshold voltage value Vth of the transfer transistor is lowered below a target value, thereby resulting in an increase in off leakage current.

In succession, an insulation film is deposited on the entire surface of the substrate and subjected to an etch-back process to form a sidewall insulation film on sidewalls of the gate electrode 5. Then, after a photoresist layer pattern is formed to expose the photodiode region, p-type impurity ions are injected into a surface of the photodiode n-type impurity region 7 to form a photodiode p-type impurity region. However, when the etch-back process is performed to form a spacer on the sidewalls of the gate electrode 5, the surface of the photodiode region may exhibit ion damage resulting from increased crystal defects. Consequently, the resulting CMOS image sensor may suffer from an increase of dark-current. Accordingly, to solve this problem, a spacer block mask has been used instead of forming the spacer.

Specifically, referring to FIG. 3C, after the photoresist film pattern 9 is formed to expose the photodiode region without forming the spacer, p-type impurity ions are injected into the surface of the photodiode n-type impurity region 7 to form the photodiode p-type impurity region 10.

Subsequently, referring to FIG. 3D, an insulation film 11 and a photoresist film are deposited on the entire surface of the semiconductor substrate in this sequence and subjected to exposure and development processes, such that a photoresist film pattern 12 is formed to cover the photodiode region. After that, referring to FIG. 3E, the insulation film 11 is selectively removed by use of the photoresist film pattern 12 as a mask to form a spacer block mask 11a.

The spacer block mask forming process as described with reference to FIGS. 3C to 3E is advantageous to minimize the generation of ion damage on the surface of the photodiode region. However, due to the fact that the p-type impurity ions are injected into the surface of the photodiode n-type impurity region 7 prior to forming the spacer block mask, the p-type impurity ions may be heavily doped with an increased density in a source region of the transfer transistor (See FIGS. 1 and 2). This increases a potential barrier in the transfer of electric charges generated from the photodiode, resulting in an increase of dead zone, which exposes the sensor to an excessive quantity of light and thus, prevents the generation of signals for a certain amount of time. Further, when the p-type impurity ions are injected, they may have an effect on a region below the gate electrode of the transfer transistor, thereby deteriorating the channeling of the transfer transistor.

SUMMARY OF THE INVENTION

Accordingly, the present invention is directed to a CMOS image sensor and a method for manufacturing the same that substantially obviate one or more problems due to limitations and disadvantages of the related art.

The present invention provides a CMOS image sensor and a method for manufacturing the same, wherein a n-type doping is performed at a portion where a photodiode and a transfer transistor are adjacent to each other prior to doping the photodiode, whereby an increase of dark current and the generation of dead-zone can be minimized.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, a CMOS image sensor comprises a semiconductor substrate having first conductive type, and having a photodiode region and a transistor region; a gate electrode formed on the transistor region of the substrate; and a first impurity region of second conductive type formed in a portion of the semiconductor substrate between the photodiode region and the gate electrode.

The CMOS image sensor can further comprise a second impurity region of the second conductive type formed in the photodiode region of the semiconductor substrate.

The second impurity region can have a depth deeper than a depth of the first impurity region.

In another aspect of the present invention, there is provided a method for manufacturing a CMOS image sensor comprising the steps of preparing a semiconductor substrate of first conductive type having a photodiode region and a transistor region; forming a gate electrode on the transistor region of the semiconductor substrate; and forming a first impurity region of second conductive type in a portion of the semiconductor substrate between the photodiode region and the gate electrode.

The second impurity region can be is formed by performing a higher energy ion injection than that performed to form the first impurity region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to a CMOS image sensor and a method for manufacturing the same according to a preferred embodiment of the present invention, examples of which are illustrated in the accompanying drawings. Wherever possible, the same reference numbers will be used throughout the drawings to refer to the same or like parts.

FIGS. 4A to 4E are sectional views illustrating the sequential processes of a CMOS image sensor manufacturing method according to an exemplary embodiment of the present invention.

Figure 1:
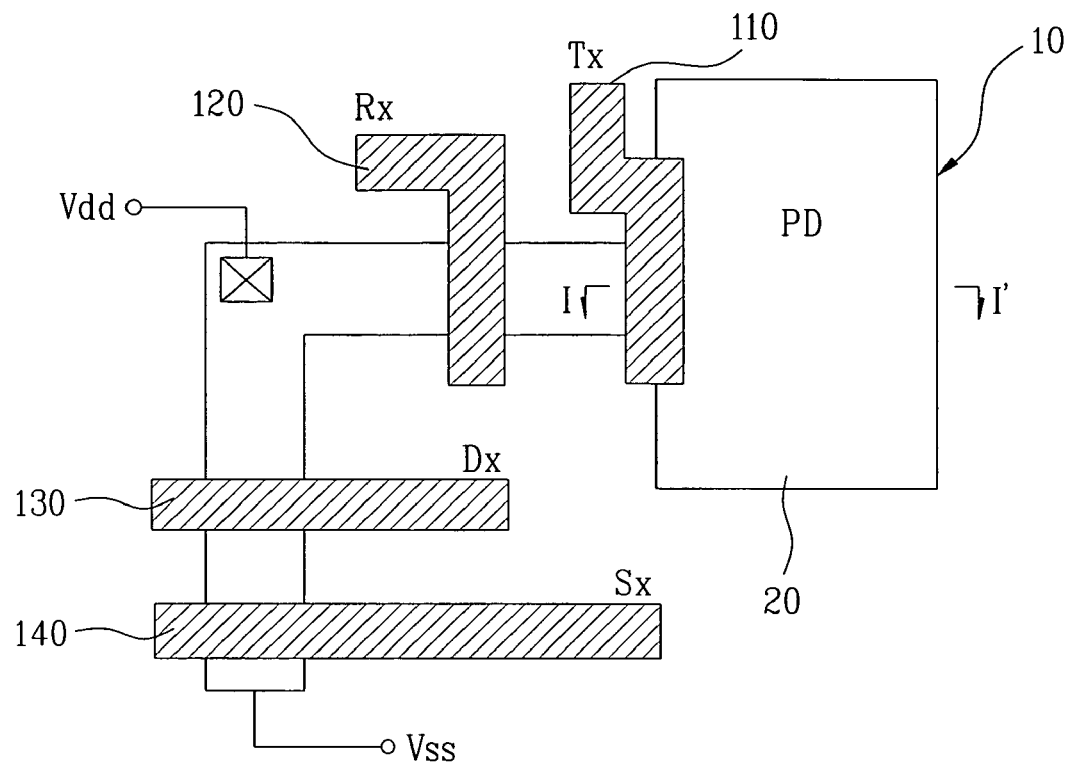
FIG. 1 is a diagram illustrating the layout of a unit pixel provided in a conventional CMOS image sensor.
Figure 2:
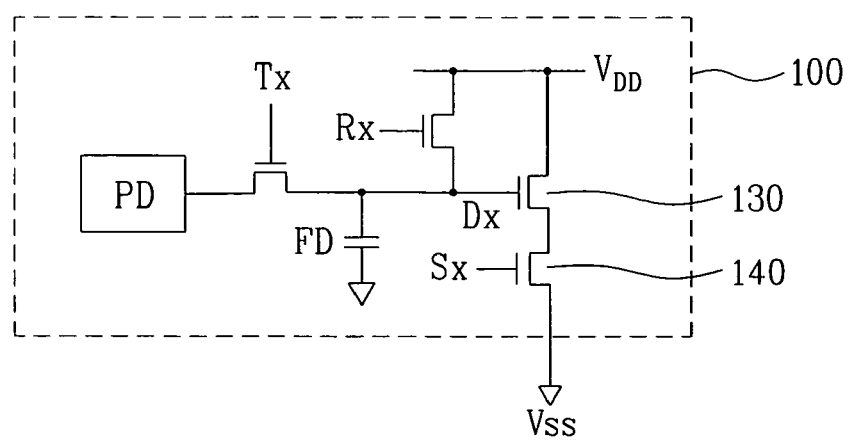
FIG. 2 is an equivalent circuit diagram illustrating the unit pixel of the conventional CMOS image sensor of FIG. 1.
Figure 3A:
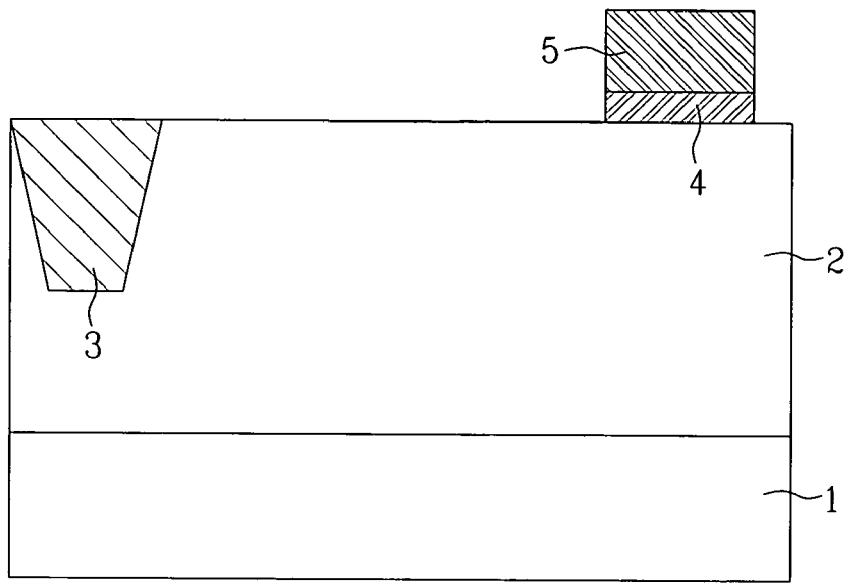
FIGS. 3A to 3E are sectional views of a CMOS image sensor manufactured in accordance with a conventional manufacturing method.
Figure 3B:
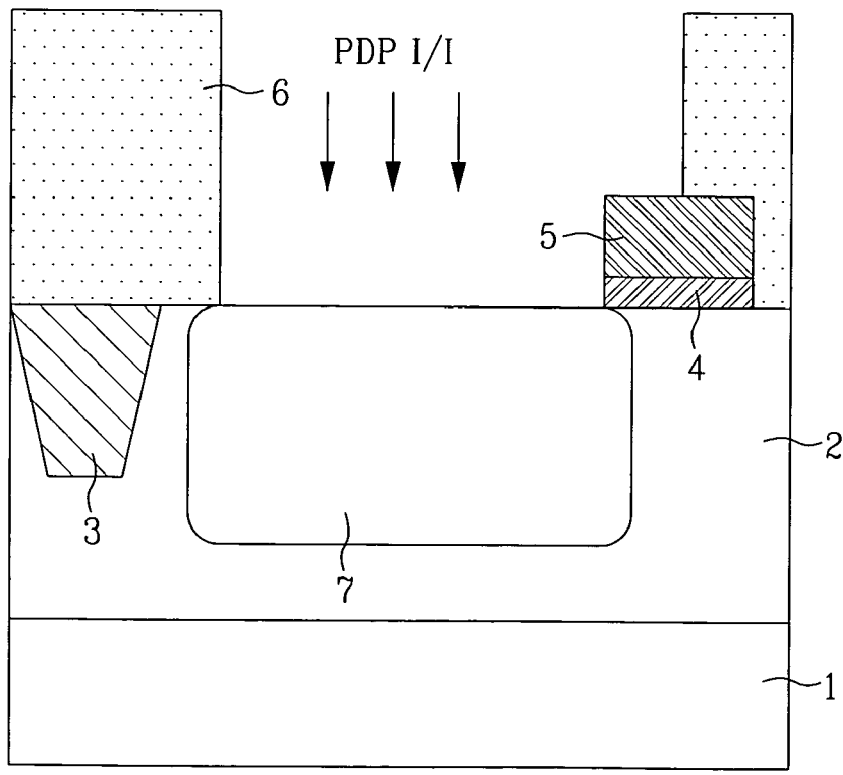
Figure 3C:
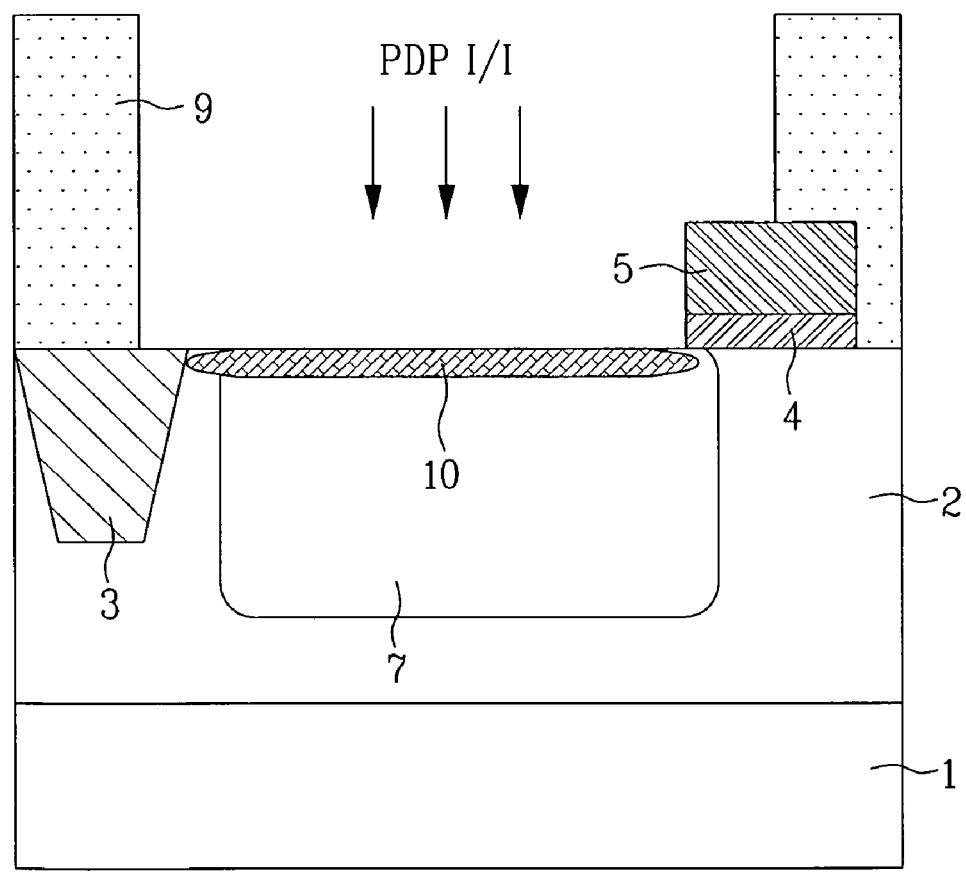
Figure 3D:
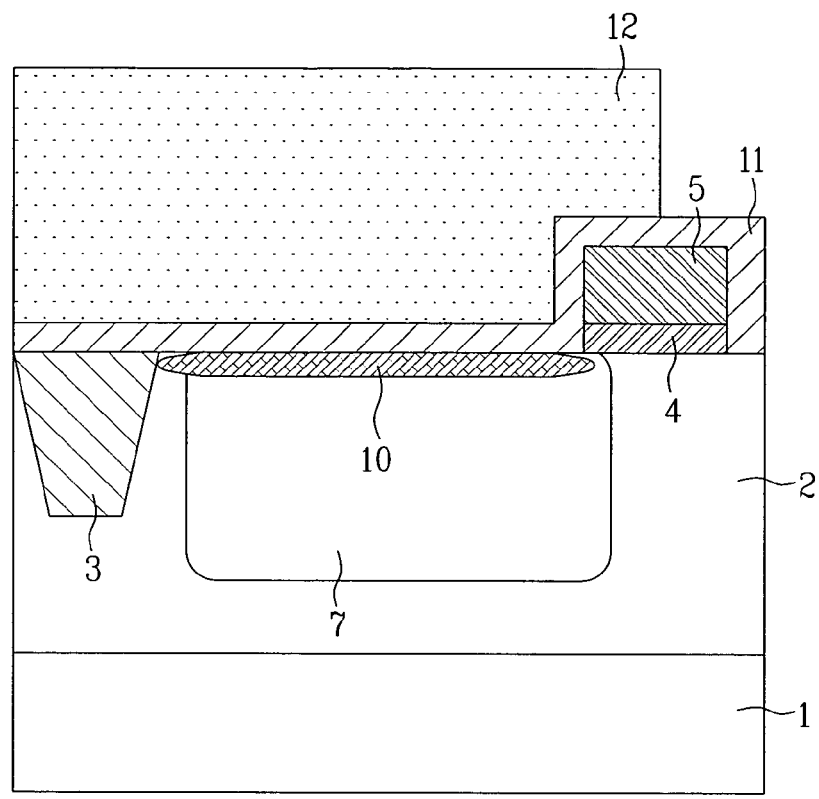
Figure 3E:
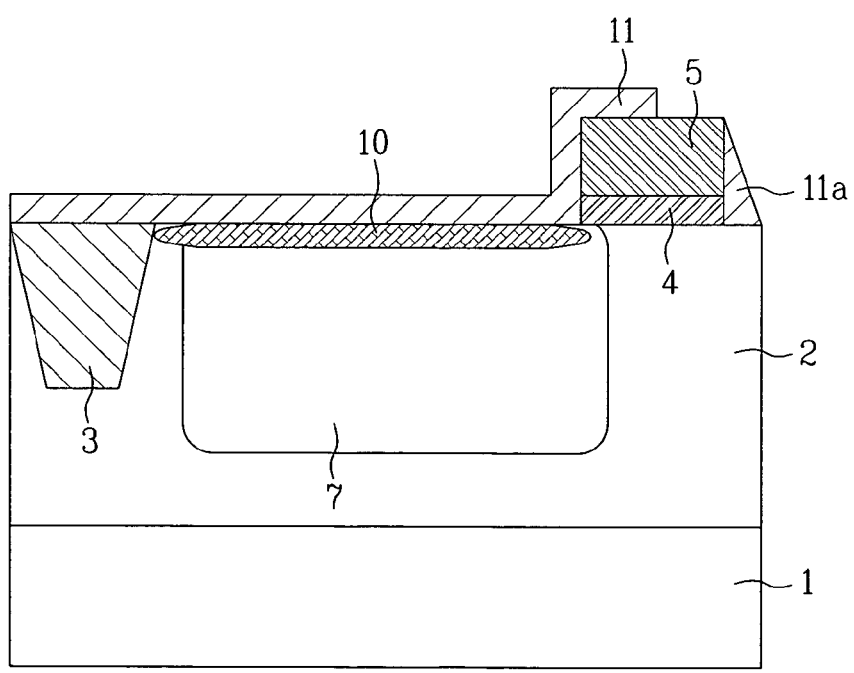
Figure 4A:
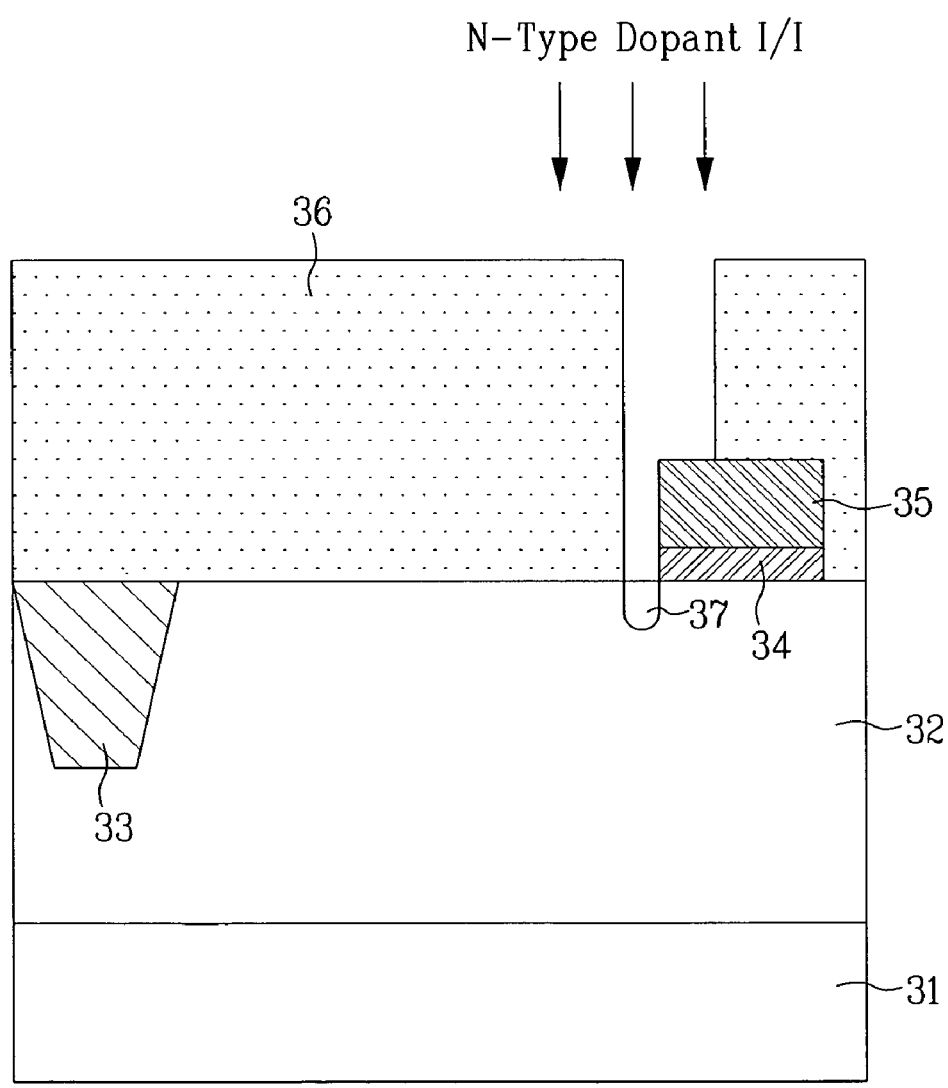
FIGS. 4A to 4E are sectional views of a CMOS image sensor manufactured in accordance with an exemplary embodiment of the present invention.

Referring to FIG. 4A, a low-density p-type epitaxial layer 32 is formed on a p-type semiconductor substrate 31. Subsequently, by use of a mask pattern which defines an active region and a device isolation region, the epitaxial layer 32 of the device isolation region is etched to a predetermined depth to form a trench. Then, an $O_3$ TEOS film is formed on the substrate to fill the trench and is patterned using a chemical mechanical polishing (CMP) process to remain only in the trench region. In this way, a device isolation film 33 is formed in the device isolation region.

A gate insulation film and a conductive layer are then formed on an entire surface of the substrate in this sequence and are selectively removed to form a gate insulation film 34 and a gate electrode 35.

In succession, a photoresist film is deposited on the entire surface of the substrate and is subjected to exposure and development processes, such that a photoresist film pattern 36 is formed to expose the p-type epitaxial layer 32 of a photodiode region adjacent to the gate electrode 35 of the transfer transistor. Then, n-type impurity ions are injected into the epitaxial layer 32 using the photoresist film pattern 36 as a mask to form a first n-type impurity region 37. After the formation of the first n-type impurity region 37, the photoresist film pattern 36 is removed.

Here, the first n-type impurity region 37 ensures the transfer transistor can smoothly transfer electric charges, and enables the use of a low-energy ion injection required to form the junction of a logic transistor. The implementation of the low-energy ion injection, consequently, can prevent a gate channeling phenomenon of the transfer transistor.

Figure 4B:
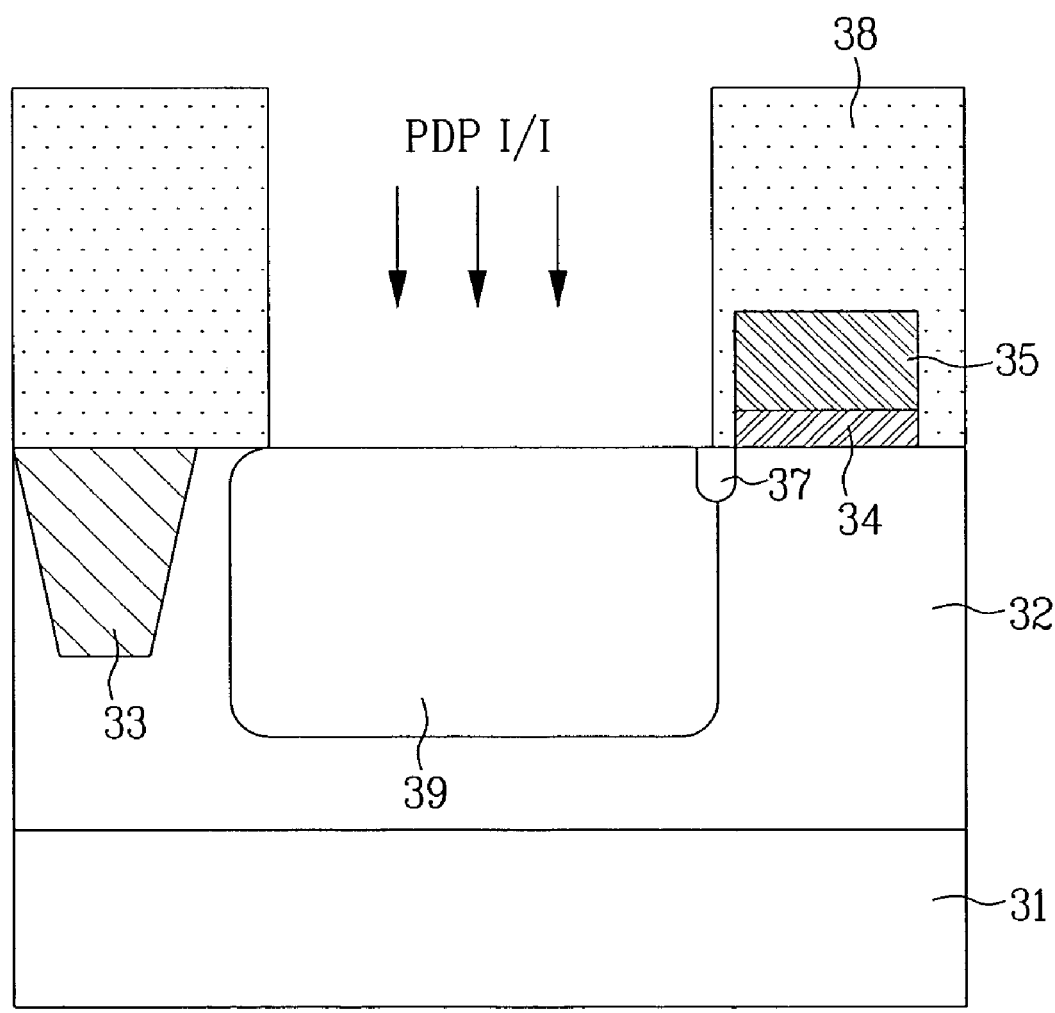

Referring to FIG. 4B, a photoresist film is deposited on the entire surface of the substrate and is subjected to exposure and development processes, such that a photoresist film pattern 38 is formed to expose the photodiode region. Specifically, the photoresist film pattern 38 is configured such that it exposes the photodiode region while covering a part of the active region adjacent to the device isolation film 33 and a part of the first n-type impurity region 37. Then, n-type impurity ions are injected into the exposed photodiode region, i.e. the epitaxial layer 32 of the photodiode region, via a high-energy ion injection process, to form a second n-type impurity region 39. After the formation of the second n-type impurity region 39, the photoresist film pattern 38 is removed. Here, the second n-type impurity region 39 has a depth deeper than a depth of the first n-type impurity region 37.

Figure 4C:
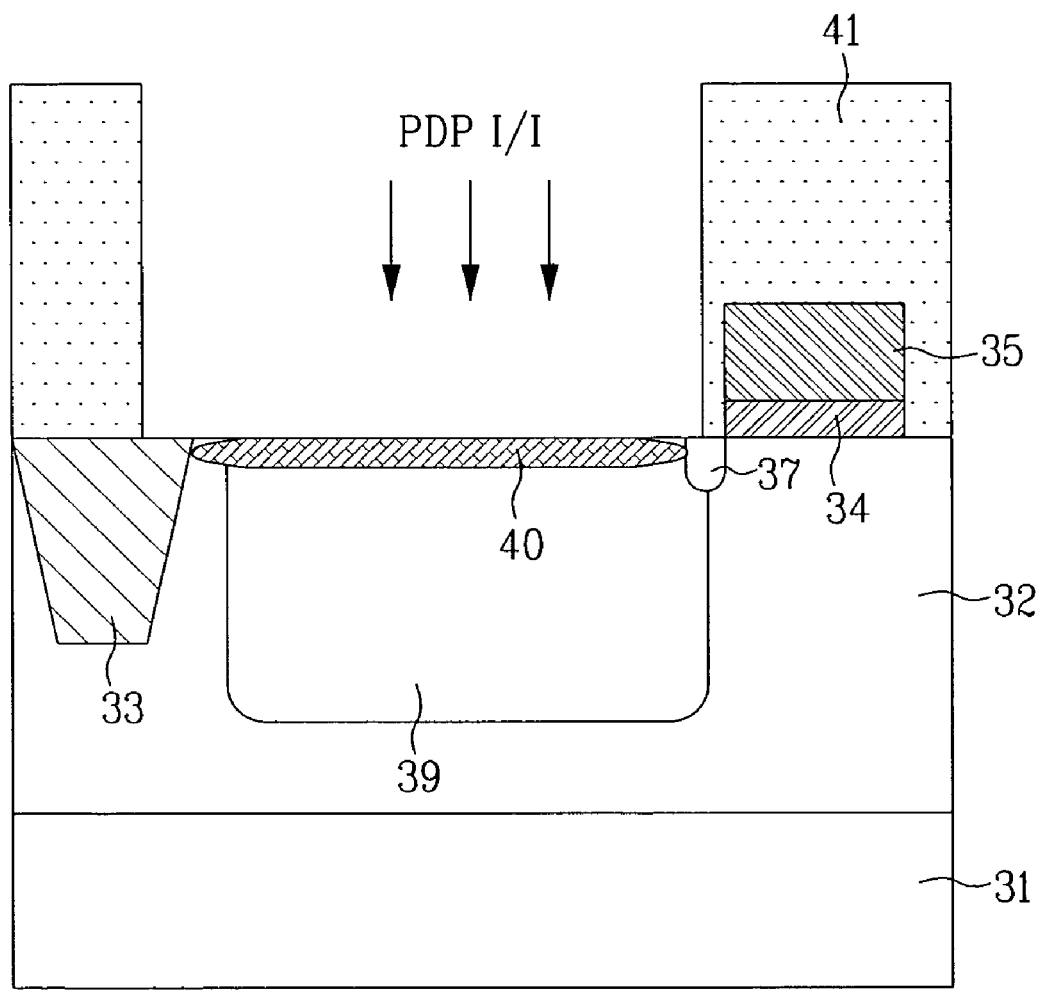

Referring to FIG. 4C, a photoresist film is deposited on the entire surface of the substrate and is subjected to exposure and development processes, such that a photoresist film pattern 41 is formed to expose the photodiode region. Then, p-type impurity ions are injected into the surface of the second n-type impurity region 39 by use of the photoresist film pattern 41 as a mask to form a photodiode p-type impurity region 40. After the formation of the photodiode p-type impurity region 40, the photoresist film pattern 41 is removed.

Figure 4D:
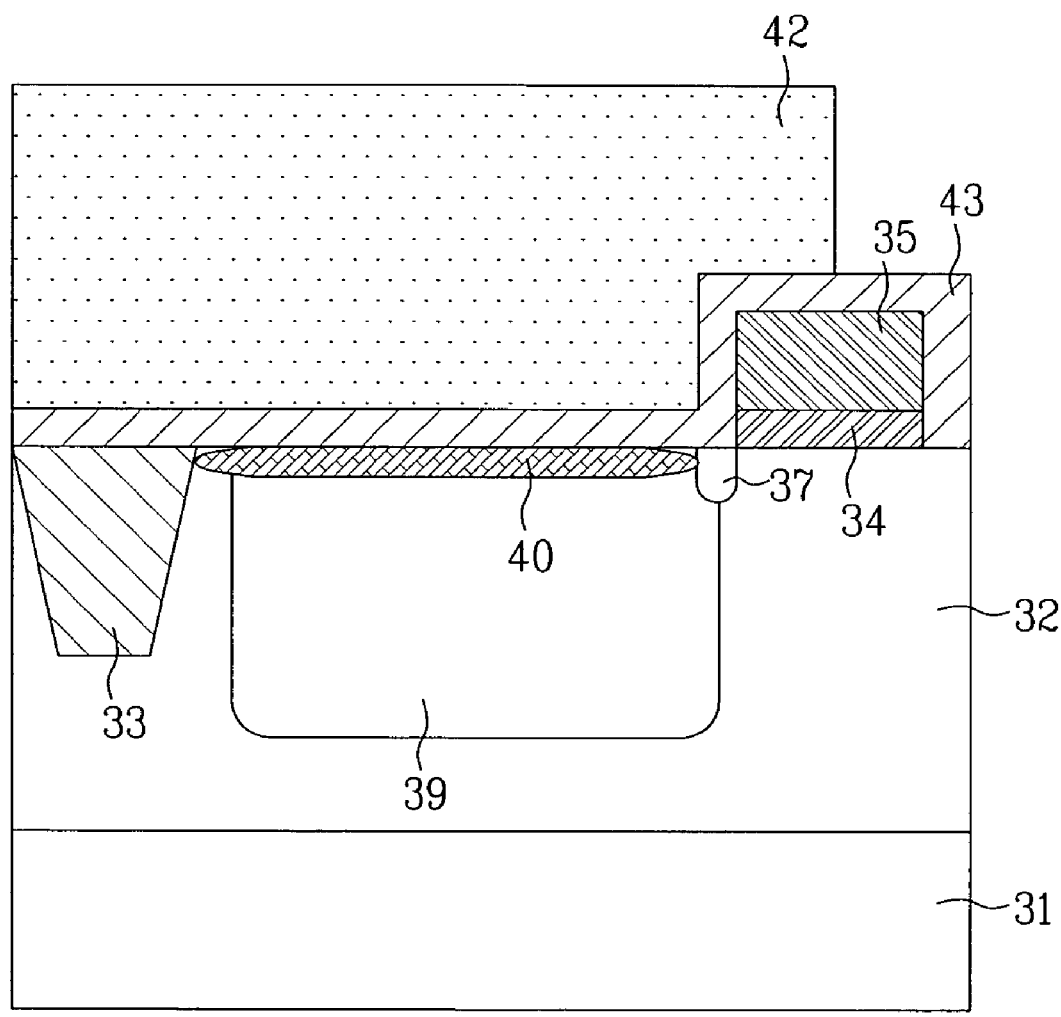

Referring to FIG. 4D, an insulation film 43 and a photoresist film are deposited on the entire surface of the semiconductor substrate in this sequence and are subjected to exposure and development processes to form a photoresist film pattern 42 to cover the photodiode region.

Figure 4E:
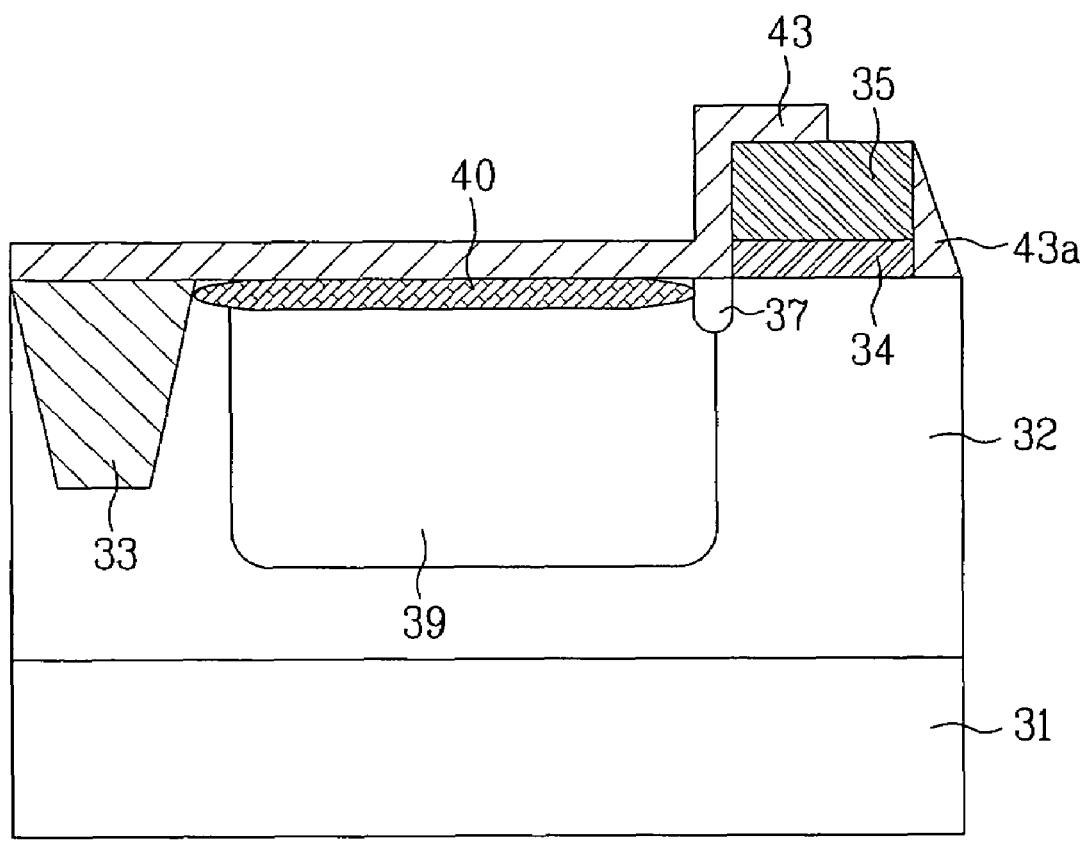

Referring to FIG. 4E, the insulation film 43 is subjected to an anisotropic etching using the photoresist film pattern 42 as a mask to form a spacer block mask 43a.

As shown in FIG. 4E, the CMOS image sensor of the present invention, manufactured by the above-described sequential processes, has a configuration wherein the first n-type impurity region 37 is formed between the photodiode region of the p-type epitaxial layer 32 and the gate electrode 35 of the transfer transistor, and the second n-type impurity region 39 and the p-type impurity region 40 are formed in the epitaxial layer 32 of the photodiode region.

As apparent from the above description, a CMOS image sensor and the method for manufacturing the same according to the present invention have at least the following effects.

First, according to an exemplary embodiment of the present invention, a first n-type impurity region is formed between a photodiode and a gate electrode of a transfer transistor prior to forming a photodiode. This ensures the transfer transistor can smoothly transfer electric charges, and enables the use of a low-energy ion injection required to form the junction of a logic transistor. Therefore, the present invention has the effect of preventing a gate channeling phenomenon of the transfer transistor.

Second, according an exemplary embodiment of the present invention, after the formation of the first n-type impurity region between the photodiode and the gate electrode of the transfer transistor, a second n-type impurity region is formed in the photodiode region prior to forming the photodiode. Accordingly, the gate channeling phenomenon of the transfer transistor can be more effectively prevented.

Third, as a result of forming the first n-type impurity region between the photodiode and the gate electrode of the transfer transistor, it is possible to prevent the generation of a dead-zone during the formation of a photodiode p-type impurity region.

Fourth, the present invention has the effect of preventing ion damage from being generated on a surface of the photodiode during the formation of a spacer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a CMOS image sensor comprising the steps of:
    preparing a semiconductor substrate with a first conductive type, including a photodiode region and a transistor region;
    forming a gate electrode on the transistor region of the semiconductor substrate;
    forming a first impurity region with a second conductive type in a portion of the semiconductor substrate between the photodiode region and the gate electrode;
    forming a second impurity region of the second conductive type in the photodiode region of the semiconductor substrate; and
    forming an impurity region of the first conductive type in a portion of the semiconductor substrate corresponding to an upper surface of the second impurity region.

2. The method as set forth in claim 1, wherein the second impurity region is formed by performing a higher energy ion injection than that performed to form the first impurity region.

3. The method as set forth in claim 1, wherein the first conductive type is p-type, and the second conductive type is n-type.

4. The sensor as set forth in claim 1, wherein the gate electrode is for a transfer transistor.

* * * * *